United States Patent [19]

Stanley

[11] Patent Number: 4,871,244
[45] Date of Patent: Oct. 3, 1989

[54] MOVABLE MEMBER MOUNTING

[75] Inventor: Ian W. Stanley, Ipswich, England

[73] Assignee: British Telecommunications public limited company, United Kingdom

[21] Appl. No.: 80,469

[22] PCT Filed: Oct. 16, 1986

[86] PCT No.: PCT/GB86/00628
 § 371 Date: Jun. 12, 1987
 § 102(e) Date: Jun. 12, 1987

[87] PCT Pub. No.: WO87/02472
 PCT Pub. Date: Apr. 23, 1987

[30] Foreign Application Priority Data

Oct. 16, 1985 [GB] United Kingdom ............... 8525458
Oct. 16, 1985 [GB] United Kingdom ............... 8525459
Oct. 16, 1985 [GB] United Kingdom ............... 8525460
Oct. 16, 1985 [GB] United Kingdom ............... 8525461
Oct. 16, 1985 [GB] United Kingdom ............... 8525462
Oct. 23, 1985 [GB] United Kingdom ............... 8526189

[51] Int. Cl.4 ............................................. G02B 2/08
[52] U.S. Cl. ................................................. 350/486
[58] Field of Search ............................... 350/486, 487

[56] References Cited

U.S. PATENT DOCUMENTS 1,438,974 12/1922 Wente ................................ 350/487
2,920,529 1/1960 Blythe ............................... 350/487

FOREIGN PATENT DOCUMENTS 0040302 11/1981 European Pat. Off. .
2127987 4/1984 United Kingdom .

OTHER PUBLICATIONS

Patents Abstracts of Japan, vol. 6, No. 2, (P-96), (880), Jan. 8, 1982, & JP, A, 56126818, (Nippon Denshin Denwa Kosha K.K.), Oct. 5, 1981.

Primary Examiner—Bruce Y. Arnold
Assistant Examiner—Rebecca D. Gass
Attorney, Agent, or Firm—Nixon & Vanderhye

[57] ABSTRACT

The mounting of a movable member such as an optical mirror (3) by bridges (4–7) between a pair of supports (1, 2). The support (1, 2) bridges (4–7) and mirror (3) are integrally formed from a silicon substrate. A pair of electrically conductive paths (8, 9) are formed by doping or metallizing portions of the assembly so that by passing controlled currents through the paths, thermal expansion of parts of the paths will cause deflection of the mirror (3). The assembly is particularly useful for deflecting optical beams.

23 Claims, 2 Drawing Sheets

MOVABLE MEMBER MOUNTING

This application is related to my copending commonly assigned applications Ser. Nos. 07/080,464 and 07/080,456 both filed June 12, 1987.

The invention relates to the mounting of a movable member, for example the mounting of an optical mirror.

In the field of optical signal transmission, it is important to be able to deflect an optical beam through a controlled angle. Previous proposals have involved the location of a torsion plate using a substrate, the torsion plate defining an optical mirror and being deflectable under the control of electrostatic fields. These arrangements are complex in construction and it is difficult to obtain accurate control of the deflection angle. In addition the torsion plate has very few degrees of freedom.

In accordance with the present invention, we provide an assembly of at least two supports and a movable member mounted by respective connecting members between the supports, the electrical conductivity of the assembly being such that at least one electrically conductive path extends from a support to the movable member and thereafter to the or another support, the resistivity of the path being such that the passage of a working current along the path causes thermal expansion of one or more of the connecting members and the movable member thereby causing movement of the movable member relatively to the supports.

With this invention, control of the position of the movable member is achieved by relying on the thermal expansion properties of one or more of the connecting members and the movable member itself. This reduces the complexity of the construction and also leads to accurate control of the deflection angle. Furthermore, the invention enables constructions to be developed in which the movable member may be moved in any direction.

The invention is particularly useful when the movable member comprises an optical mirror but in other applications, the movable member may be used as a support for other optical components such as diffraction gratings, laser diodes and the like whose angular position must be accurately controlled.

Preferably, the supports, connecting members, and the movable member are all integrally formed and this may typically be achieved by using a micromachining technique to etch a substrate. For example, the assembly may be made from silicon and have relatively small dimensions. These features all lead to a relatively low manufacturing cost.

In a very simple arrangement, the movable member may be mounted between the supports by two connecting members. Preferably, however, the movable member is mounted to each support by a pair of connecting members. Conveniently, each pair of connecting members is substantially colinear, the pairs being substantially parallel.

Preferably, all the connecting members are electrically conductive since this leads to a larger number of deflection angle directions being obtainable.

In some examples, part of at least one of the electrical paths is defined by an electrically conductive portion of the movable member. Preferably, the or each electrically conductive part of the movable member has a higher resistivity than the remainder of the electrically conductive path.

In this case, thermal expansion of the movable member will cause the connecting members to deflect and thus the movable member will be moved to a position substantially parallel with its rest position thus resulting in a piston like movement. This is particularly useful where the movable member defines one end of a laser cavity.

The resistivity of the or each connecting member forming part of an electrically conductive path may be higher than the remainder of the electrically conductive path. This provides flexibility, particularly where two or more electrical paths are defined between the supports across the movable member since a larger number of deflection directions can be obtained.

Coveniently, a single current source is provided which is connected by a control means to a selected electrical path or paths. Alternatively, a number of current sources may be provided, for example one corresponding to each electrical path, control means controlling whether the current source is connected to the respective electrical path.

Typically, the parts of the support, connecting members, and movable member which define the or each electrical path are doped or metallised in a known manner.

Some examples of assemblies in accordance with the present invention will now be described with reference to the accompanying drawings, in which.

Figure 1:
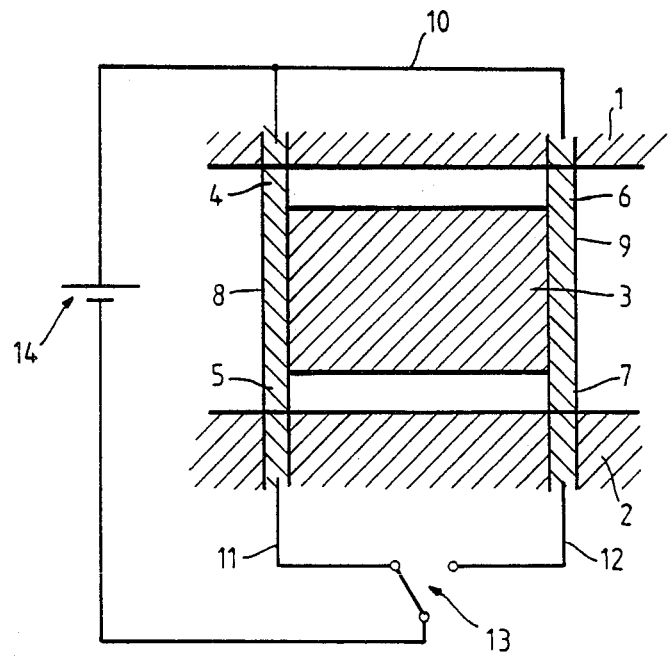
FIG. 1 is a schematic diagram of a first example illustrating the connection of the electrical paths with a current source.

The example shown in FIG. 1 is constructed from a relatively thin single crystal silicon substrate using conventional micromachining or anisotropic etching techniques. The assembly comprises a pair of support members 1, 2 between which is mounted a thin plate 3. The plate 3 is mounted between the supports 1, 2 by bridges 4–7. It should be appreciated that the support members 1, 2, the bridges 4–7 and the plate 3 are all integrally formed.

The plate 3 may be between one and several mm square while the bridges 4–7 will have lengths between 10 and 100 μm or more.

A pair of electrically conductive paths 8, 9 are formed between the two support members 1, 2. This is achieved by either doping or metallising respective pairs of bridges 4, 5; 6, 7 and connecting portions of the plate 3 together with adjacent portions of the support members 1, 2. The paths 8, 9 are connected at one end with a common electrical conductor 10 and at the other end to respective electrical conductors 11, 12. The conductors 11, 12 terminate at a switch 13. The switch 13 and the conductor 10 are connected to a current source 14.

In all these examples, cross-hatching in the drawings indicates electrically conductive parts although portions of these parts may have different resistivities.

In the FIG. 1 example, the doping or metallisation is such that the bridges 4–7 have a higher resistivity than the supports 1, 2 while the portions of the plate 3 connecting the bridges 4, 5; 6, 7 respectively have a low resistivity relatively to the remainder of the silicon plate.

In operation, the switch 13 is connected either to the conductor 11 or the conductor 12 and the current is passed through the respective path 8,9. Due to the relatively high resistivity of the bridges, the passage of a current through the bridges will cause an increase in their temperature and hence result in expansion of the bridge material thus causing deflection of the plate 3. For example, passing a current through the path 8 will cause the bridges 4, 5 to expand and thus the plate 3 will rotate about an axis defined by the path 9. Similarly, a current passed along the path 9 will cause expansion of the bridges 6, 7 and hence rotation of the plate 3 above an axis defined by the path 8.

In a modification, not shown, the same current could be passed through both paths 8, 9 simultaneously. This would result in movement of the plate 3 to a position parallel with its rest position (shown in FIG. 1) thus resulting in a piston action. This type of action will be particularly useful where the plate 3 constitutes an end of a laser cavity.

Pivotal movement of the plate 3 may be used for deflecting an incident optical beam of radiation towards one of a number of different optical components where the plate comprises a mirror or the device may be used for other applications such as wavelength selection where the plate carries a reflection diffraction grating. This is explained in more detail in my copending application of even date entitled Wavelength Selection Device and Method where the ability to deflect in any direction is particularly advantageous (above-cited Ser. number 07/080,464).

To appreciate the degree of movement involved, consider a bridge having a length of 1 cm. The coefficient of linear thermal expansion for silicon is $2.33 \times 10^{-6} °C.^{-1}$. Thus a 1 cm length bridge will increase in length to 1.00023 cm for a 100° C. temperature rise. This will cause transverse movement of the end of the bridge adjacent the plate of about 0.021 cm. In the case of a piston movement, the sensitivity is thus 0.00021 cm/°C. or 2.1 $\mu$m/°C. The deflection angle is 1.23°.

It should also be noted that the direction of the deflection can be adjusted by non-uniform doping of the bridges leading to the bridges having different resistivities. This would result in movement which was not about an axis defined by one of the electrical paths.

Figure 2:
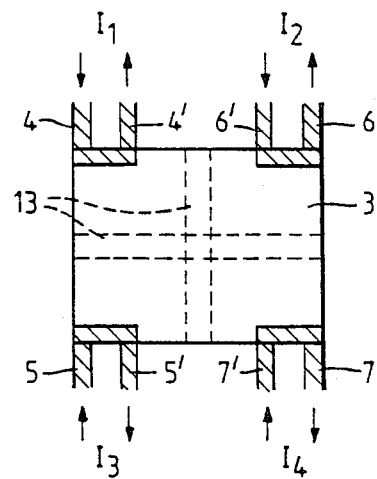
FIGS. 2 and 3 are views similar to FIG. 1, but omitting the electrical connections and the supporting substrate illustrating two further examples; and, FIG. 4 is a view similar to FIG. 1, but omitting the electrical connections, of a fourth example.
Figure 3:
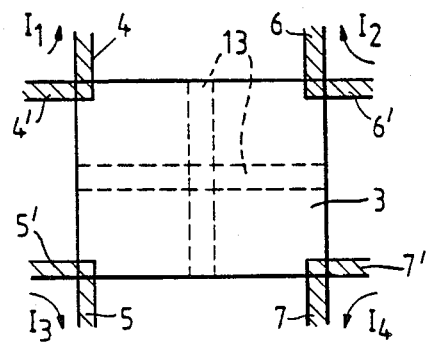

FIGS. 2 and 3 illustrate two further examples which have more flexibility than the example shown in FIG. 1. In these examples, each corner of the plate 3 is mounted by a pair of bridges 4, 4'–7, 7' to the supports (not shown). Each pair of bridges 4, 4' etc is connected to individual electrical circuits so that the current through each pair of bridges can be separately controlled. These currents are labelled $I_1$–$I_4$ respectively.

To ensure that stray currents do not flow through the silicon plate 3, the bridges may be made significantly less resistive than the silicon material or blocking regions 13 can be inserted by suitable doping of the plate 3.

By controlling each of the four currents $I_1$–$I_4$ separately, the plate 3 can be deflected angularly about any desired axis in the plane of the plate. A parallel, piston action can be obtained by using all four currents together.

In general, it is desirable to be able to monitor the degree of deflection imparted on the plate 3. This may be achieved by positioning four capacitance sensors (not shown), one near each edge or corner of the plate 3. These sensors will provide electrical signals for automatic position control in a known manner. Optical sensing methods may also be used for position control.

Figure 4:
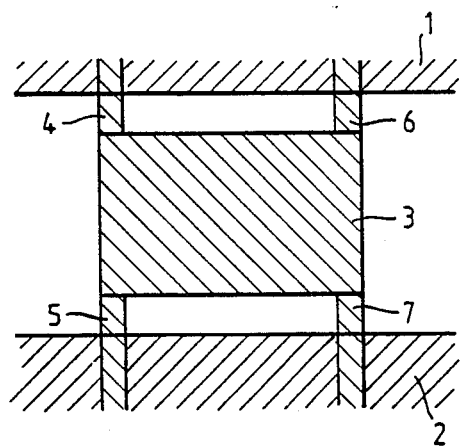

If parallel (or piston) deflection only is required then the plate 3 itself can be made conductive but less conductive than the bridges 4–7. This is shown in FIG. 4. In this example, the same current I passes through the bridges 4, 6 into the plate 3 and out from the plate 3 across the bridges 5, 7. The plate 3 itself then expands and produces the parallel movement.

I claim:
1. An assembly of:
at least two supports and
a movable member mounted by respective connecting members between the supports,
the electrical conductivity of the assembly being such that at least one electrically conductive path extends from a support to the movable member and thereafter to a support,
the resistivity of the path being such that the passage of a working current along the path causes thermal expansion of at least one of the connecting members and the movable member thereby causing movement of the movable member relatively to the supports.

2. An assembly according to claim 1, wherein the movable member is mounted to each support by a pair of connecting members.

3. An assembly according to claim 2, wherein all the connecting members are electrically conductive.

4. An assembly according to any of the preceding claims, wherein part of at least one of the electrical paths is defined by an electrically conductive portion of the movable member.

5. An assembly according to claim 4, wherein an electrically conductive part of the movable member has a higher resistivity than the remainder of the electrically conductive path.

6. An assembly according to any of the preceding claims 1, 2 or 3, wherein the resistivity of a connecting member forming part of an electrically conductive path is higher than the remainder of the electrically conductive path.

7. An assembly according to claim 2, wherein two electrical paths are defined between the supports across the movable member.

8. An assembly according to claim 6, wherein four electrical paths are provided, each associated with a respective pair of connecting members.

9. An assembly according to any of the preceding claims 1, 2, or 3, further comprising at least one current source; and control means for controlling the flow of current from each current source through each electrical path.

10. An assembly according to any of the preceding claims 1, 2 or 3, wherein the supports, connecting members, and the movable member are all integrally formed.

11. An assembly according to any of the preceding claims 1, 2, or 3, wherein those parts of the support, connecting members, and movable member which define each electrical path are doped or metallised.

12. An assembly according to any of the preceding claims 1, 2, or 3 which is made from silicon.

13. An assembly according to any of the preceding claims 1, 2 or 3, wherein the movable member comprises an optical mirror.

14. A unitary, integral, structure including an optical component mounted for controlled movements therewithin, said structure comprising:
   an optical component mounted to said substrate by at least one electrically conductive bridge member integral with said substrate;
   said bridge member having sufficient resistivity to cause its controlled thermal expansion upon the passage of correspondingly controlled electrical current therethrough; and
   said at least one bridge member being disposed between the substrate and optical component so as to cause controlled relative movement of said optical component with respect to said substrate in response to said controlled thermal expansion.

15. A structure as in claim claim 14 wherein:
   said substrate, said optical component and said at least one bridge member are formed from an integral silicon crystal having selectively doped portions to define at least one electrically conductive path having said sufficient resistivity and passing through selected portions of said substrate, said optical signal component and said at least one bridge member.

16. A structure as in claim 15 including four of said bridge members, one disposed near each corner of a rectilinearly shaped said optical component which is thereby supported between at least two opposing walls of said substrate.

17. A structure as in claim 16 wherein said bridge members all are oriented parallel to one another.

18. A structure as in claim 17 wherein pairs of said parallel bridge members are also co-linearly oriented.

19. A structure as in claim 14 or 15 wherein said optical component comprises a mirror.

20. A structure as in claim 14 or 15 wherein said optical component comprises a diffraction grating.

21. A structure as in claim 14 wherein said optical component comprises a laser diode.

22. A structure as in claim 14 or 15 wherein said relative movement comprises rotation about a predetermined axis.

23. A structure as in claim 14 or 15 wherein said relative movement comprises translational piston-like motion of the optical component.

* * * * *